United States Patent [19]

Mars

[11] Patent Number: 4,816,789

[45] Date of Patent: Mar. 28, 1989

[54] SOLDERLESS, PUSHDOWN CONNECTORS FOR RF AND DC

[75] Inventor: Jeffrey R. Mars, Huntington, N.Y.

[73] Assignee: United Technologies Corporation, Hartford, Conn.

[21] Appl. No.: 165,826

[22] Filed: Feb. 25, 1988

Related U.S. Application Data

[63] Continuation of Ser. No. 864,667, May 19, 1986, abandoned.

[51] Int. Cl.$^4$ ............................................. H01P 3/08
[52] U.S. Cl. ..................................... 333/246; 439/65; 439/92; 439/510; 333/260
[58] Field of Search ...................... 333/238, 246, 260; 361/413; 439/59–62, 65, 67, 74, 77, 92, 101, 108, 109, 507, 510–514, 609

[56] References Cited

U.S. PATENT DOCUMENTS

| | | | |
|---|---|---|---|
| 3,218,584 | 11/1965 | Ayer | 333/84 |
| 3,218,585 | 11/1965 | May | 333/84 |
| 3,270,311 | 8/1966 | Deer et al. | 439/65 |
| 3,701,964 | 10/1972 | Cronin | 439/77 |
| 4,116,517 | 9/1978 | Selvin et al. | 439/67 |
| 4,143,342 | 3/1979 | Cain et al. | 333/33 |
| 4,208,642 | 6/1980 | Saunders | 333/246 |
| 4,255,003 | 3/1981 | Berg | 439/71 |
| 4,349,241 | 9/1982 | Juris et al. | 439/609 |
| 4,455,537 | 6/1984 | La Prade et al. | 333/33 |
| 4,528,530 | 7/1985 | Ketchen | 333/246 |

FOREIGN PATENT DOCUMENTS 1070067  5/1967  United Kingdom ................ 439/65

OTHER PUBLICATIONS

IBM Bulletin, "Interconnection Devices", by J. F. Smith, vol. 9, No. 2, Jul. 1966.
Low–Noise Interconnection System for Monolithic Modules–L. T. Olson.
Bridge Connector–E. C. Uberbacher.
The Encyclopedia of Physics–Robert M. Besancon.

*Primary Examiner*—Gil Weidenfeld
*Assistant Examiner*—Gary F. Paumen

[57] ABSTRACT

A connector arrangement (13) for electrically connecting first and second microstrip structures (15,15') carrying for example RF and DC voltage values therebetween, the groundplates of the connector arrangement (13) and said microstrip structures (15,15') establishing an offset stripline arrangement, the dielectric layer of the connector arrangement (13) being substantially thicker and the dielectric constant thereof substantially lower in value than the corresponding values of the dielectric layers of said microstrip structures (15,15'), thereby enabling the metalization lines (18, 20 and 21) in the connector arrangement (13) to be relatively wide to enable effective alignment of microstrip structures (15,15') and connector arrangement (13).

14 Claims, 1 Drawing Sheet

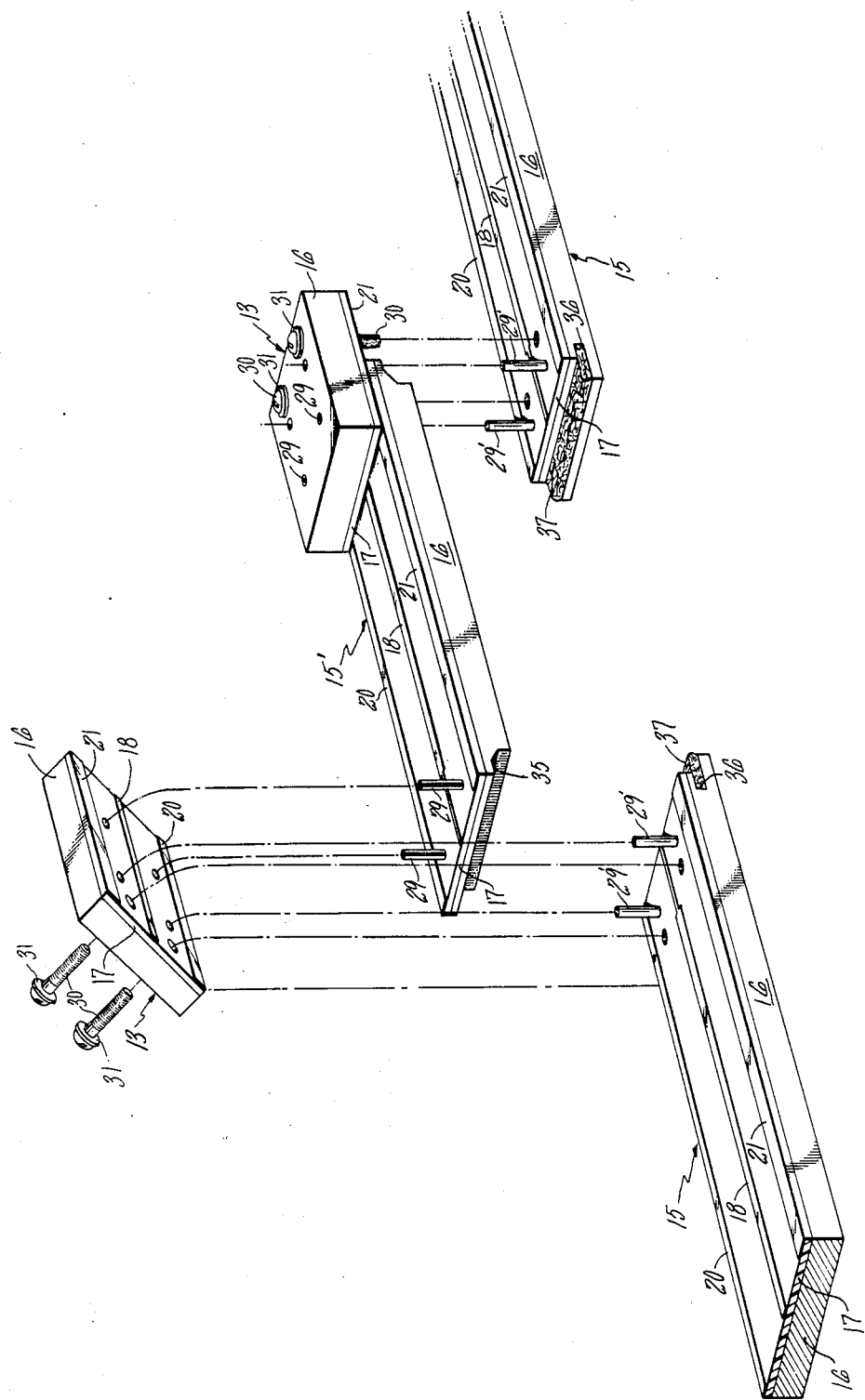

SOLDERLESS, PUSHDOWN CONNECTORS FOR RF AND DC

This application is a continuation of Ser. No. 864,667, filed May 19, 1986, now abandoned.

TECHNICAL FIELD

The invention herein is directed toward the art of solid state microwave and radar arrangements, and in particular, toward the technology of solderless RF and DC connectors for replaceable microwave modules.

BACKGROUND ART

A problem frequently addressed in the art of solid state microwave and radar devices is the effective and convenient insertion or interconnection purposes of replaceable microwave modules such as selected circuit modules or microstrip elements with portions of another, larger microwave system. Such modules, may for example contain amplifiers or other electric circuit arrangements. Having such circuit arrangements set in modules makes packaging and maintenance more convenient and less expensive. Furthermore, the use of modules reduces space requirements overall.

The use of such modules, however, carries with it new problems which need to be addressed. In particular, special difficulties arise when solder connections are made between replaceable modules and the rest of the system.

Standard or conventional male-female pairs of connectors, which are frequently used to establish such connections, are simply unsatisfactory because they require a significant amount of space in order for connections to be established initially, and additional room to slide the connected modules apart when breaking the connection.

In the case of soldered joints, the surfaces of land portions of both the replaceable module and the connector are frequently damaged during maintenance and replacement, because they tend to lift up and degrade upon heating to soften the solder joint during replacement, thereby effectively destroying the module or at least a portion thereof. Still, such soldered joints do have the advantage of being able to be closely abutted with respect to each other, thereby saving space.

SUMMARY OF INVENTION

According to the invention, a solderless connector is usable renewably to connect separable microstrip elements for both RF and DC purposes.

The connector device according to a version of the invention is effective for matchingly coupling microstrip conductor structures on a mother board with corresponding microstrip conductor structures and circuitry of a replaceable module, by establishing a stripline structure for connecting microstrip structures. The RF and DC voltages are thus transitioned in matched fashion from microstrip to stripline (pursuant to the connector) and back to microstrip again.

The connector device, according to the invention herein, is of the character of a push-down coupler, which places selected circuit modules directly adjacent to each other, thereby saving considerable space. Further, since the connections are "push-down" in nature and not soldered, no heat is required as would normally be employed to solder and resolder the connector device during maintenance, repair and replacement, thereby preserving the integrity of the modules on the long term.

This feature of push-down coupling further permits vertical-drop insertion of the coupler device into place to accomplish replacement of selected circuit modules, thereby promoting enhanced packaging density and eliminating the possibility of solder and reheating damage.

Other features and advantages of the invention will be apparent from the specification and claims and from the accompanying drawings which illustrate an embodiment of the invention.

BRIEF DESCRIPTION OF DRAWING

The FIGURE attached herewith is an isometric, exploded view of two connectors for insertion of a single replaceable circuit module between two other stripline structures which are part of a larger microwave or RF system, according to the invention herein.

BEST MODE FOR CARRYING OUT THE INVENTION

The FIGURE in particular shows a pair of solderless, pushdown connector devices 13 for carrying RF and DC voltage signals and levels, according to the invention herein. The invention is in the first instance directed toward one of the connectors 13, but in some cases, as shown, an arrangement of two connectors 13 in series is of significant interest. For example, the connectors 13 could be used to permit the insertion of a selected microstrip circuit module 15' between one or more microstrip structures 15.

In particular, each connector device 13 is effective for transitioning or connecting a first microstrip structure 15 to an adjacent such microstrip structure 15', which in this case is a selected circuit module albeit not showing much circuitry beyond metalization lines 18, 20 and 21. Another version of microstrip structure 15' could be a circuit module including for example amplifiers or any other selected circuit arrangement according to designer choice. Microstrip structure 15' and one or both connectors 13 can be taken to be a single cooperative unit for the sake of discussion. Each of microstrip structures 15 and 15' typically exhibits an output impedance of about fifty ohm according to one version of the invention.

Further, each of the microstrip structures 15 and 15' typically includes a relatively thick conductive groundplate 16 fabricated out of aluminum for example. Additionally, each microstrip structure 15 and 15' includes a dielectric layer 17 joined, by as well-known lamination, adhesion or solder techniques, to the underlying groundplate 16.

On top of this dielectric layer 17, in each case, are metalization lines including RF metalization lines 18 establishing an RF signal line, a power supply or Vcc metalization line 20 and a return metalization line 21. The Vcc and return lines, respectively 20 and 21, are primarily DC voltage carriers used to drive circuitry (not shown) which as noted may be fixed on the surface of microstrip structure 15'. Such circuitry would typically require connection with both DC and RF signal inputs. The respective metalization lines can be made or established by well known thin or thick film deposition and etching techniques as layers upon the surfaces of dielectric surfaces 17.

By way of additional information, the dielectric layers 17 on microstrip structures 15 and 15' typically have relatively high dielectric values, e.g. a dielectric constant equal about ten (10), about as high as commercially available, in order to maximize component density on microstrip structures 15 and 15'. Further, according to a preferred version of the invention, the dielectric layers 17 are structured in multiple layers, one of which may be a thick solid Teflon ® dielectric material, and another of which may be a thin, compressible rubber dielectric layer which can provide an environmental seal.

The corresponding metalization lines (i.e., RF metalization lines 18, Vcc line 20 and return line 21) on the connector devices 13 are however fabricated on a relatively low dielectric constant substrate, again backed by a relatively thick conductive groundplate 16 as will be seen. This dielectric material is selected to have as low as possible a dielectric constant, preferably one close to the dielectric constant of air, which is one (1). The lowest constant value dielectric material which is found to be generally commercially available, however, has a constant of only about two (2).

The invention, according to a preferred mode, includes a connector device 13 which extends over the edges of adjacent microstrip structures 15 and 15' to be electrically coupled for DC and/or RF purposes. This permits adjacent metalizations 18, 20 and 21 to communicate electrically.

It is significant that the combination of connector device 13 and adjacent putative microstrip portions 15 and 15' establishes stripline regions. By way of simple definition, microstrip has air on one side; stripline has the metalization lines bounded by dielectric (non-air) materials.

Mechanical coupling between connector devices 13 and adjacent microstrip structures 15 or 15' is accomplished by inserting roll pins 29 and guide pins 29' into pre-established vertical and closely fitting apertures suitably fashioned as by drilling, for example, in adjacent portions of connector devices 13 and the selected one or ones of microstrip structures 15 and 15'.

The insertion of roll pins 29 and guide pins 29' is intended precisely to align corresponding metalization lines on respective microstrip structures 15 and 15' with corresponding metalization lines on 18, 20 and 21 with their connector 13, much better than could be accomplished by mere insertion of a typical screw or bolt, in view of the play typically existing between adjacent threads of screws and bolts and the material through which they are threaded.

The widths of the respective metalization lines 18, 20, and 21 may vary, since for DC purposes the line widths are determined by current-carrying requirements; and for RF purposes, consideration of characteristic impedance is paramount. As a result, the DC lines are significantly wider than the RF lines as indicated in the Drawing.

According to one version of the invention, adjacent microstrip structures 15 and 15' include corresponding, cooperative lips 35 and control groove 36 machined into a selected one of corresponding structures 15 and 15'. This permits the fittable insertion of RF conductive gasket material 37 into the groove 36. The conductive gasket material 37 in particular fits tightly between adjacent groundplates 16 and thereby ensures a good ground connection for connector 13 for RF signals transmitted between adjacent microstrip structures 15 and 15'.

As suggested above, connector 13 is formed of a low dielectric constant material in comparison with the microstrip structures 15 or 15' connected therewith.

This enables each connector 13 to be combined with adjacent portions of microstrip structures 15 and 15' in a matched fashion, as will be seen. The connector 13 accordingly includes a relatively thick groundplate 16 of its own, constructed of an electrically conductive material such as aluminum, for example, and further includes adheringly adjacent thereto a relatively thick layer 17 of low dielectric constant material. Precisely how thick the dielectric layer 17 of material is to be is determinable according to the relationships set forth below.

Were a high dielectric constant used for connector 13, the width of RF line 18 in connector 13 would have to be very substantially narrower than the general width of the metalization lines on microstrip structures 15 and 15'. A metalization line width which is very narrow in the overlapping portions of connector 13 and structures 15 and 15' would be prohibitively difficult to align, even with highly accurate roll pins 29.

According to the invention herein, the respective microstrip structures 15 and 15' and connector 13 are electrically impedance matched and the RF signal line widths of the overlapping portions of connector 13 and microstrip structures 15 and 15' are made substantially comparable although as seen in the Drawing, slightly narrower, according to one version, than the non-overlapping portions of the RF signal lines. This ensures good alignment and adequate electrical interconnection between the adjacent RF signal lines.

To establish an adequately wide RF metalization line 18 in overlapping portions of connector 13 and microstrip structures 15 and 15', it is necessary that the RF metalization line 18 be presented with as low an effective dielectric constant as possible. This is accomplished by using a low dielectric constant material in connector 13 and by making the dielectric material 17 in the connector 13 greater in thickness than the dielectric material in microstrip structures 15 and 15', thereby in effect offsetting metalization lines 18, 20, and 21 away from the center of the combination of connector 13 and microstrip structures 15 and 15'. According to one version of the invention, a dielectric thickness roughly twice the thickness of the microstrip dielectric layer is employed in connector 13.

Additionally, threaded screws 30 extending through lock washers 31, for example, are used to join connector 13 to adjacent microstrip structures 15 and 15' and particularly to engage corresponding metalization lines 18, 20 and 21. These screws 30 further electrically connect respective groundplates of each connector 13 and microstrip structures 15 and 15'.

The metalization lines 18, 20 and 21 are arranged, etched away or deposited so as to avoid electrical connection with screws 30 and groundplates 16.

To determine an appropriate thickness of dielectric material for connector 13, it is noted that the characteristic impedance "Z" is known and that the effective stripline dielectric constant "$E_r$" is, for example, related thereto according to the following equation: $Z = 10^{12}(E_r)^{\frac{1}{2}}/3 \times 10^{10} \times 0.0885(C_{p1} + C_{p2} + 2C_{f1} + 2C_{f2})$, where "$E_r$" is the effect stripline dielectric constant taking into account the connector structure 13, "$C_{p1}$" and "$C_{p2}$" are respective first and second plate capacitances between respective metalization lines 18 and the groundplates 16 of respectively connectors 13 and microstrip structures 15 and 15', and "$C_{f1}$" and "$C_{f2}$" are the corresponding fringing capacitances therebetween.

"$E_r$" in turn equals $[E_1t_2+E_2t_1]/[t_2+t_1]$ where "$t_1$" and "$t_2$" respectively are the thickness of the first and second dielectric layers 17 on opposite sides of stripline 18 in connector assembly 13. This relationship for $E_r$ is derived from the equation $C=nE_r/t_1+nE_r/t_2$ which in turn equals $nE_1/t_1+nE_2/t_2$, where "C" is the per unit capacitance o the connector assembly 13, "n" represents per unit capacitive area of stripline 18 (equal to $0.0885\times w$ according to a preferred version of the invention, "w" being stripline 18 width). From these relationships, it directly follows that $E_rt_2+E_rt_1=E_1t_2+E_2t_1$ which in turn produces the relationship of interest for $E_r$ indicated above, i.e., that $E_r=E_1t_2+E_2t_1]/[t_2+t_1]$.

The plate and fringe capacitances are determinable according to the following relationships: $C_{p1}=[0.0885 E_{r1}w]/[(b/2-s)-t_1/2]$; $C_{p2}=[0.0885 E_{r2}w]/[(b/2+s)-t_2/2]$; $Cf_1=(0.0885 E_1)([2/(1-t/(b-s))][\log_e([1/(1-t/(b-s))]+1)]-[1/(-1-t/(b-s))-1][\log_e(1-t/(b-s))^2-1)])$; and $Cf_2=(0.0885 E_2)([2/(1-t/b+s))][\log_e([1/(1-t/(b+s))]+1)]-[(1/(1-t/b+s))-1][\log_e(1/(-1-t/(b+s))^2-1)])$, where "0.0885" is an empirical constant indicative of length for per unit capacitance, "b" is the total dielectric thickness including the separation distance of the metalization of the stripline conductor, "s" and "t" are the respective thicknesses of the stripline offset and the metalization conductors. The values "t" and "s" are known a priori. Thus, solving the equation for "b" is possible.

This makes it possible to implement the invention with impedance matching between the microstrip structures 15 and 15' and the connector 13. According a preferred version of the invention, this occurs when $Z=50$ ohm. $E_1$ and $E_2$ are known, because one is a given value and according to the invention the other is selected to be significantly lower. Similarly, the thickness of the dielectric layer in connector 13, subject of course to practical considerations such as cost, which according to a preferred embodiment of the invention results in the dielectric thickness of connector 13 being about twice that of structures 15 and 15'. This ensures that the width of the metalization lines 18 in the connector 13 will be as wide as possible to ensure overlap and effective electrical conduction.

It should be understood that the invention is not limited to the particular embodiments shown and described herein, but that various changes and modifications may be made without departing from the spirit and scope of this novel concept as defined by the following claims.

I claim:

1. A replaceable solderless microwave connection system for connecting planar microwave transmission lines, comprising:

first and second planar microwave transmission lines, each having a transmission line impedance for microwave radiation determined by a base RF planar conductor of predetermined base conductor width, extending along an axis and separated from at least one ground plane and supported by a predetermined transmission line dielectric thickness of a first dielectric having a first dielectric constant;

a microwave connector, including a bridge RF planar conductor having a predetermined bridge conductor width, in mechanical and electrical contact with a predetermined overlap portion of said base RF planar conductors and separated from a second ground plane parallel to said first ground plane by a predetermined bridge dielectric thickness of a second dielectric having a second dielectric constant, said second ground plane and said second dielectric extending above said overlap portion of said base RF planar conductors and thereby forming a microwave stripline transmission line having said first and second ground planes and a combined Rf conductor formed said base and bridge RF conductors characterized in that:

said base conductor widths of said base RF planar connectors and said transmission line dielectric thickness are related such that each of said first and second planar microwave transmission lines is a microstrip line, whereby microwave radiation passes from a first said microstrip line to said microwave stripline line and back to a second said stripline transmission line;

said first dielectric constant is substantially greater in magnitude than said second dielectric constant;

said bridge dielectric thickness is substantially greater than said transmission line dielectric thickness;

said bridge RF planar conductor and said base RF planar conductors are in removable, non-bonded mechanical contact, whereby said microwave connector may be mechanically removed by translation perpendicular to said axis and to said first and second ground planes; and said first and second ground planes are connected by at least one removable conductive member that extends through said first and second dielectrics at a predetermined location offset from said axis, whereby said conductive member, said line dielectric thickness and said bridge dielectric thickness of said first and second dielectrics, and said first and second predetermined widths together form a microwave stripline impedance substantially matched to said transmission line impedance.

2. A connection system according to claim 1, further characterized in that:

said second dielectric includes at least one layer of a compressible dielectric that has an uncompressed thickness greater that a compressed thickness, whereby said predetermined bridge thickness includes said compressed thickness; and said bridge RF planar conductor and said base RF planar conductors are held in removable, nonbonded mechanical contact by mechanical fastening means extending through said first and second dielectrics at a predetermined location offset from said axis and exerting compressive force on said compressible dielectric to reduce said uncompressed thickness to said compressed thickness, whereby compression is applied ti said second dielectric without enlarging the dimensions of said connector or affecting the removability thereof.

3. A connection system according to claim 1, further characterized in that:

each of said first and second planar microwave transmission lines includes first and second supplementary conductors for carrying electric power at frequencies below the microwave range, disposed on opposite sides of said base RF planar conductor;

said microwave connector also includes corresponding first and second supplementary conductors, whereby additional signals may be connected by said connection system; and said mechanical fastening means and said removable conductive member are disposed between said base RF planar conductor and said first and second supplementary.

4. A connection system according to claim 3, further characterized in that:
said first and second supplementary conductors carry power supply voltage of ground and a supply voltage.

5. A connection system according to claim 2, further characterized in that: said bridge dielectric thickness is approximately twice said transmission line dielectric thickness.

6. A connection system according to claim 2, further characterized in that:
each of said first and second planar microwave transmission lines includes first and second supplementary conductors for carrying electric power at frequencies below the microwave range, disposed on opposite sides of said base RF planar conductor;
said microwave connector also includes corresponding first and second supplementary conductors, whereby additional signals may be connected by said connection system; and
said mechanical fastening means and said removable conductive member are disposed between said base RF planar conductor and said first and second supplementary conductors.

7. A connection system according to claim 6, further characterized in that:
said first and second supplementary conductors carry power supply voltages of ground and a supply voltage.

8. A replaceable solderless microwave connection system for connecting planar microwave transmission lines, comprising:
first and second planar microwave transmission lines, each having a transmission line impedance for microwave radiation determined by a transmission base RF planar conductor of predetermined base conductor width, extending along an axis and separated from at least one ground plane and supported by a predetermined transmission line dielectric thickness of a first dielectric having a first dielectric constant;
a replaceable microwave circuit module containing at least one microwave circuit element connected to first and second said microwave transmission lines;
first and second microwave connectors, each including a bridge RF planar conductor having a predetermined bridge conductor width, in mechanical and electrical contact with predetermined overlap portions of said transmission base RF planar conductors and said corresponding base RF planar conductors and separated from a second ground plane parallel to said first ground plane by a predetermined bridge dielectric thickness of second dielectric having a second dielectric constant, said second ground plane and said second dielectric extending above said overlap portion of said transmission and corresponding base Rf planar conductors and thereby forming a microwave stripline transmission line having said first and second ground planes and combined RF conductor formed from said transmission base, said corresponding base and said bridge RF conductors, characterized in that:
said base conductor widths and said transmission line dielectric thickness are related such that each of said first and second planar microwave transmission lines and said corresponding microwave circuit element is a microstrip line, whereby microwave radiation passes from a first said microstrip line to a said bridge conductor and then to said module microstrip line and correspondingly back from said module microstrip line to another said bridge conductor and then to a said second microstrip line;
said first dielectric constant is substantially greater in magnitude than said second dielectric constant;
said bridge dielectric thickness is substantially greater than said transmission line dielectric thickness;
said bridge RF planar conductor and said base Rf planar conductors are in removable, non-bonded mechanical contact, whereby said microwave connectors may be mechanically removed by translation perpendicular to said axis and to said first and second ground planes; and
said first and second ground planes are connected by at least one removable conductive member that extends through said first and second dielectrics at a predetermined location offset from said axis, whereby said conductive member, said line dielectric thickness and said bridge dielectric thickness of said first and second dielectrics, and said first and second predetermined widths together form a microwave stripline impedance substantially matched to said transmission line impedance.

9. A connection system according to claim 8, further characterized in that:
said second dielectric includes at least one layer of a compressible dielectric that has an uncompressed thickness greater than a compressed thickness, whereby said predetermined bridge thickness includes said compressed thickness; and
said bridge RF planar conductor sand said base RF planar conductors are held in removable, non-bonded mechanical contact by mechanical fastening means extending through said first and second dielectrics at a predetermined location offset from said axis and exerting compressive force on said compressible dielectric to reduce said uncompressed thickness to said compressed thickness, whereby compression is applied to said second dielectric without enlarging the dimensions of said connector or affecting the removability thereof.

10. A connection system according to claim 8, further characterized in that:
each of said first and second planar microwave transmission lines includes first and second supplementary conductors for carrying electric power at frequencies below the microwave range, disposed on opposite sides of said base RF planar conductor;
said microwave connector also includes corresponding first and second supplementary conductors, whereby additional signals may be connected by said connection system; and
said mechanical fastening means and said removable conductive member are disposed between said base RF planar conductor and said first and second supplementary conductors.

11. A connection system according to claim 10, further characterized in that:

said first and second supplementary conductors carry power supply voltages of ground and a supply voltage.

12. A connection system according to claim 9, further characterized in that: said bridge dielectric thickness is approximately twice said transmission line dielectric thickness.

13. A connection system according to claim 9, further characterized in that:

each of said first and second planar microwave transmission lines includes first and second supplementary conductors for carrying electric power at frequencies below the microwave range, disposed on opposite sides of said base RF planar conductor;

said microwave connector also includes corresponding first and second supplementary conductors, whereby additional signals may be connected by said connection system; and said mechanical fastening means and said removable conductive member are disposed between said base RF planar conductor and said first and second supplementary conductors.

14. A connection system according to claim 13, further characterized in that:

said first and second supplementary conductors carry power supply voltages of ground and a supply voltage.

* * * * *

UNITED STATES PATENT AND TRADEMARK OFFICE
CERTIFICATE OF CORRECTION

PATENT NO. : 4,816,789

DATED : March 28, 1989

INVENTOR(S) : Jeffrey R. Mars

It is certified that error appears in the above-identified patent and that said Letters Patent is hereby corrected as shown below:

Column 4, line 64: after "is the" delete "effect" and insert --effective--

Column 5, line 9: after "capacitance" delete "o" and insert --of--

Column 5, line 23: after "$Cf_2$=" delete "(0.0885    $E_2$)" and insert --(0.0885 $E_2$)--

Column 5, line 35: after "According" insert --to--

Claim 1, Column 6, line 10: delete "Rf" and insert --RF-- (first occurence)

Claim 1, Column 6, line 13: delete "connectors" and insert --conductors--

Claim 1, Column 6, line 18: after "stripline" insert --transmission--

Claim 1, Column 6, line 19: delete "stripline transmission line" and insert --microstrip line--

Claim 2, Column 6, line 44: after "greater" delete "that" and insert --than--

Claim 2, Column 6, line 55: after "is applied" delete "ti" and insert --to--

Claim 3, Column 7, line 4: after "supplementary" insert --conductors--

Claim 4, Column 7, line 8: change "voltage" to --voltages-- (first occurence)

Claim 8, Column 7, line 58: after "thickness of" insert --a--

Claim 8, Column 7, line 62: delete "Rf" and insert --RF--

Claim 8, Column 7, line 65: after "planes and" insert --a--

Claim 8, Column 8, line 16: delete "Rf" and insert --RF-- (second occurence)

UNITED STATES PATENT AND TRADEMARK OFFICE
CERTIFICATE OF CORRECTION

PATENT NO. : 4,816,789.

DATED : March 28, 1989

INVENTOR(S) : Jeffrey R. Mars

It is certified that error appears in the above-identified patent and that said Letters Patent is hereby corrected as shown below:

Claim 9, Column 8, line 40: delete "sand" and insert --and--

Signed and Sealed this

Sixteenth Day of June, 1992

Attest:

DOUGLAS B. COMER

Attesting Officer

Acting Commissioner of Patents and Trademarks